(12) United States Patent
Wu

(10) Patent No.: US 11,061,067 B2
(45) Date of Patent: Jul. 13, 2021

(54) APPARATUS AND METHOD FOR A HIGH TEMPERATURE TEST AND A LOW TEMPERATURE TEST AND CONFIGURED TO MAINTAIN AN ELECTRONIC COMPONENT UNDER TEST NEAR A TEST TEMPERATURE

(71) Applicant: Chroma Ate Inc., Taoyuan (TW)

(72) Inventor: Xin-Yi Wu, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 143 days.

(21) Appl. No.: 16/509,671

(22) Filed: Jul. 12, 2019

(65) Prior Publication Data
US 2020/0033399 A1  Jan. 30, 2020

(30) Foreign Application Priority Data
Jul. 24, 2018 (TW) .................................. 107125439

(51) Int. Cl.
*G01R 31/28* (2006.01)

(52) U.S. Cl.
CPC .................................. *G01R 31/2849* (2013.01)

(58) Field of Classification Search
CPC .............. G01R 1/0458; G01R 31/2849; G01R 31/2874; G01R 31/00; G01R 31/26; G01R 31/28; H05K 7/20; F28D 15/02
See application file for complete search history.

(56) References Cited

U.S. PATENT DOCUMENTS 5,198,753 A * 3/1993 Hamburgen ....... G01R 31/2877
324/750.08
6,445,203 B1 * 9/2002 Yamashita ......... G01R 31/2856
324/750.08
(Continued)

FOREIGN PATENT DOCUMENTS

TW    201614246    *  4/2016  ............ G01R 31/26
TW    201614246 A     4/2016

OTHER PUBLICATIONS

TW Office Action dated Jun. 25, 2019 in corresponding Taiwan application (No. 107125439).
(Continued)

*Primary Examiner* — Vinh P Nguyen
(74) *Attorney, Agent, or Firm* — McClure, Qualey & Rodack, LLP

(57) ABSTRACT

An apparatus and a method provide a high temperature test and a low temperature test. The apparatus mainly includes a depressing head and a test base, wherein the depressing head includes a cooling module, a heating module, and a heat dissipation module therein, the heat dissipation module includes a finned heat sink and a heat conduction member, and the heat conduction member is thermally coupled to the heating module and the finned heat sink. When the low temperature test is performed, an electronic component is cooled by filling liquid nitrogen into the cooling module of the depressing head. When the high temperature test is performed, the electronic component is heated by the heating module. If the temperature of the electronic device is higher than a predetermined high temperature, the electronic device is cooled by the heat dissipation module.

10 Claims, 3 Drawing Sheets

(56) References Cited

U.S. PATENT DOCUMENTS

| | | | | |
|---|---|---|---|---|
| 6,545,458 B2* | 4/2003 | Yamazaki | .......... | G01R 31/2863 |
| | | | | 324/750.03 |
| 7,369,410 B2* | 5/2008 | Chen | .................. | F28D 15/0233 |
| | | | | 165/104.21 |
| 7,652,495 B2* | 1/2010 | Slaughter | ........... | G01R 31/2893 |
| | | | | 324/750.03 |
| 7,726,145 B2* | 6/2010 | Nakamura | .............. | H01L 23/34 |
| | | | | 62/259.2 |
| 10,520,528 B2* | 12/2019 | Wu | .................... | G01R 31/2877 |
| 10,753,971 B2* | 8/2020 | Saito | .................. | G01R 31/2865 |
| 2005/0078447 A1* | 4/2005 | Hamann | ............... | H01L 23/473 |
| | | | | 361/689 |

OTHER PUBLICATIONS

Search Report issued in TW Office Action dated Jun. 25, 2019 in corresponding Taiwan application (No. 107125439).

* cited by examiner

APPARATUS AND METHOD FOR A HIGH TEMPERATURE TEST AND A LOW TEMPERATURE TEST AND CONFIGURED TO MAINTAIN AN ELECTRONIC COMPONENT UNDER TEST NEAR A TEST TEMPERATURE

BACKGROUND OF THE INVENITON

Field of the Invention

The invention relates to an apparatus and a method for a high temperature test and a low temperature test, in particular to a testing apparatus and a testing method suitable for verifying the quality of an electronic component when the electronic component is heated or cooled to a predetermined temperature.

Description of the Related Art

In general, electronic components may be inevitably operated in extreme climatic environments, such as a cold climate of the frigid zone or a hot climate of the tropical zone. Electronics manufacturers and general consumers concern about whether the electronic components can work normally at a high temperature or a low temperature or not.

In order to verify whether the electronic components can work normally at different temperatures, electronic component testing factories or test equipment suppliers make great efforts to develop relevant testing apparatuses. Reference is made to FIG. 1. FIG. 1 is a conventional apparatus for a high temperature test and a low temperature test. As shown in FIG. 1, the conventional apparatus comprises a cold plate 12 connected to a lower end of a lifting arm 11, a heater 13 arranged beneath the cold plate 12 and a contact block 14 arranged beneath the heater 13.

When a low temperature test is performed, the cold plate 12 is filled with a mixture of liquid nitrogen and air. Since the temperature of the liquid nitrogen is extremely low and is about −196° C., an electronic component C to be tested can be quickly cooled to an extremely low test temperature. When a high temperature test is performed, the electronic component C is heated by the heater 13 through the contact block 14.

However, during a heating period or a testing period, the temperature of the electronic component C may reach a temperature higher than a predetermined temperature due to the fact that the electronic component C is overheated or due to excess heat caused by the high-speed operation of the electronic component C. In this case, a small amount of liquid nitrogen is filled into the cold plate 12 for heat dissipation. The heater 13 is interposed between the cold plate 12 and the electronic component C, so that the excess heat of the electronic component C can not be dissipated efficiently. The cooling effect is not good, and the liquid nitrogen is wasted.

SUMMARY OF THE INVENTION

The main object of the present invention is to provide an apparatus and a method for a high temperature test and a low temperature test capable of cooling an electronic component quickly when a low temperature test is performed, of heating the electronic component quickly when a high temperature test is performed and of efficiently dissipating heat from the electronic component under test so as to maintain a specific test temperature.

In order to achieve the above object, an apparatus for a high temperature test and a low temperature test of the present invention comprises a depressing head and a test base, the test base comprising a chip socket for receiving an electronic component, the depressing head being arranged to press the electronic component, the depressing head mainly comprising a cooling module for cooling the electronic component, a heating module for heating the electronic component and a heat dissipation module, wherein the cooling module comprises a first end face and a second end face, the heating module is abutted on the second end face of the cooling module, and the heat dissipation module comprises a finned heat sink and a heat conduction member, wherein the finned heat sink is abutted on the first end face of the cooling module, and the heat conduction member is thermally coupled to the heating module and the finned heat sink.

According to the present invention, heat is dissipated from the electronic component under test by the heat dissipation module. Specifically, heat is transferred from the heating module to the finned heat sink by the heat conduction member of the heat dissipation module, and then heat is dissipated from the finned heat sink to the atmosphere. As such, heat generated by the electronic component under test can be dissipated so that the test is prevented from being disadvantageously affected. The heat conduction member of the present invention may be a heat pipe, a heat conduction graphite sheet or other equivalent elements having a good thermal conductivity, for example, an element or material that absorbs heat by phase change for heat transfer.

Preferably, the apparatus for a high temperature test and a low temperature test of the present invention further comprises a pressing member, a depressing frame and a depressing arm. The pressing member can be connected to the heating module. The pressing member is not only arranged to press the electronic component but also functions as a medium for thermal conduction. The pressing member may be a modular member, that is, a suitable respective pressing member can be selected and mounted on the depressing head according to specifications of an electronic component to be tested. Moreover, the cooling module, the heating module, the heat dissipation module and the pressing member can be mounted in the depressing frame, and the depressing arm can be connected to the depressing frame for moving the depressing frame upwardly and downwardly.

At least one of the cooling module and the heating module of the apparatus for a high temperature test and a low temperature test of the present invention can be provided with a chamber into which a thermal fluid medium is to be filled or a flow channel through which the thermal fluid medium is to be circulated. In other words, heat exchange is realized by filling the thermal fluid medium into the chamber or circulating the thermal fluid medium through the flow channel, so that a cold source or a heat source is formed to cool or heat the electronic component. Furthermore, the heating module for the electronic component of the present invention may comprise a heater. According to the present invention, the electronic component may be cooled or heated by a thermoelectric cooling chip. However, the cooling module and the heating module of the present invention are not limited to those as mentioned above, and any other means suitable for heating or cooling the electronic component may be used.

The heat dissipation module of the apparatus for a high temperature test and a low temperature test of the present invention may further comprise a fan for moving an airflow across the finned heat sink. The fan may be mounted on one side of the finned heat sink. The fan is provided to enhance heat dissipation from the finned heat sink and is capable of dissipating the heat of the electronic component in a controllable manner by activation or inactivation of the fan.

In order to achieve the above object, a method for a high temperature test and a low temperature test of the present invention comprises the steps of: providing an electronic component onto a test base and pressing the electronic component by means of a depressing head; and heating or cooling the electronic component by the depressing head so that a temperature of the electronic component reaches a predetermined high temperature or a predetermined low temperature and then performing the high temperature test or the low temperature test, wherein when the low temperature test is performed, the electronic component is cooled by filling liquid nitrogen into a cooling module of the depressing head; wherein when the high temperature test is performed, the electronic component is heated by a heating module of the depressing head, and the electronic component is be cooled by a heat dissipation module of the depressing head if the temperature of the electronic component is higher than the predetermined high temperature. Accordingly, the method of the present invention is capable of efficiently and quickly maintain the test temperature at a constant temperature without wasting energy.

Preferably, in the method for a high temperature test and a low temperature test of the present invention, the heat dissipation module includes a finned heat sink, a heat conduction member and a fan, wherein the heat conduction member is thermally coupled to the heating module and the finned heat sink. When the high temperature test is being performed, the electronic component can be cooled by moving
an airflow across the finned heat sink by activation of the fan if the temperature of the electronic component is higher than the predetermined high temperature.

According to the method for a high temperature test and a low temperature test of the present invention, in a case that the high temperature test and the low temperature test are performed in this order, after the high temperature test is finished and before the low temperature test is initiated, the electronic component is cooled to a specific temperature by moving an airflow across the finned heat sink by activation of the fan, and then the electronic component is further cooled to the predetermined low temperature by filling liquid nitrogen into the cooling module of the depressing head. In other words, according to the present invention, the electronic component is cooled to about room temperature by the heat dissipation module, and then the electronic component is further cooled to a lower temperature by the liquid nitrogen.

DESCRIPTION OF THE PREFERRED EMBODIMENTS

Figure 1:
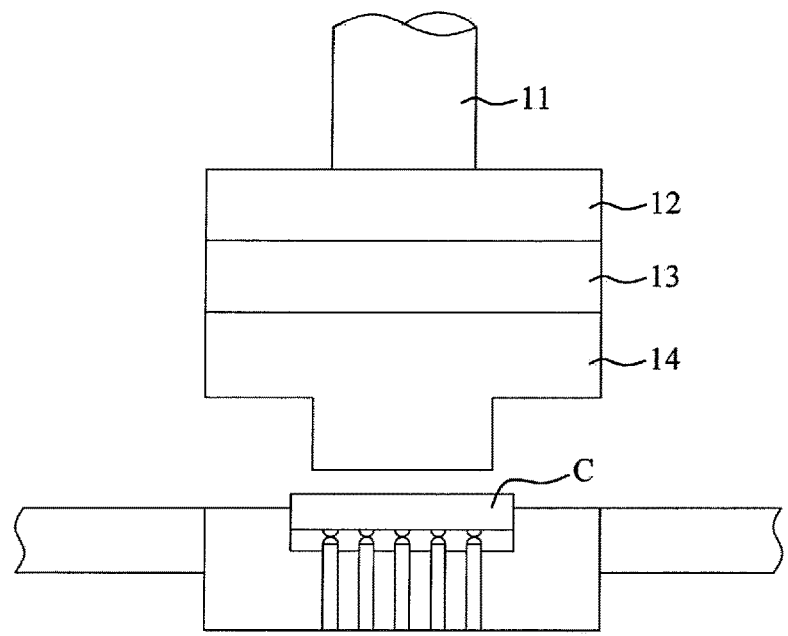
FIG. 1 is a schematic view showing a conventional apparatus for a high temperature test and a low temperature test.

In describing preferred embodiments of an apparatus and a method for a high temperature test and a low temperature test of the present invention in detail, it is noted that similar elements are designated by the same reference numerals. The drawings of the present invention are merely illustrative and are not necessarily drawn to scale, and all details are not necessarily shown in the drawings.

Figure 2:
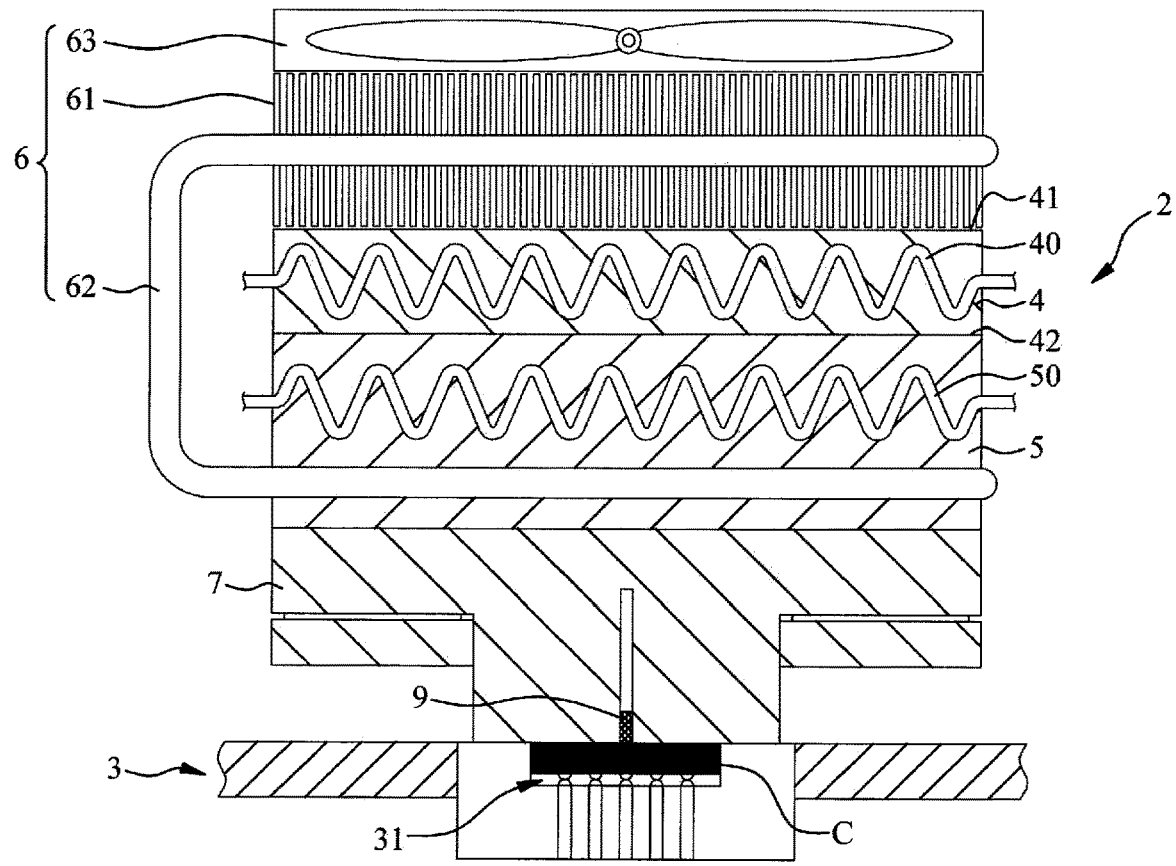
FIG. 2 is a schematic cross-sectional view of a first embodiment of the present invention.

In describing the first embodiment of the present invention, reference is made to FIG. 2. FIG. 2 is a schematic cross-sectional view showing the first embodiment of the present invention. As shown in FIG. 2, the apparatus for a high temperature test and a low temperature test of the first embodiment mainly comprises a depressing head 2 and a test base 3. The apparatus also comprises other devices (not shown in the figure), for example, a pick and place arm for transferring electronic components C, a charge magazine loaded with a plurality of electronic components C to be tested, a discharge magazine loaded with the tested electronic components.

As shown in FIG. 2, the depressing head 2 of the first embodiment mainly includes a cooling module 4, a heating module 5, a heat dissipation module 6 and a pressing member 7, wherein the heat dissipation module 6 includes a finned heat sink 61, a heat pipe 62 and a fan 63. In the depressing head 2 of the first embodiment, the fan 63, the finned heat sink 61, the cooling module 4, the heating module 5 and the pressing member 7 are arranged from the top to the bottom in this order, wherein one end of the heat pipe 62 is extended into and connected with the finned heat sink 61, and the other end of the heat pipe 62 is extended into and connected with the heating module 5.

It should be noted that in the first embodiment, the heat pipe 62 is used as the heat conduction member between the finned heat sink 61 and the heating module 5, but the heat conduction member according to the present invention is not limited to the heat pipe, and other equivalent elements having a good thermal conductivity, for example, a heat conduction graphite sheet or other elements or materials that absorb heat by phase change for heat transfer, may serve as the heat conduction member according to the present invention. The heat conduction graphite sheet is an artificial anisotropic pyrolytic graphite sheet which has an excellent in-plane thermal conductivity and a good heat insulation property in a through-plane direction and which is capable of uniformly spreading heat in an in-plane direction.

The cooling module 4 of the first embodiment is a cold plate and is provided with a flow channel 40 for circulation of a low temperature thermal fluid medium therethrough and thus for heat exchange. In the first embodiment, a mixture of liquid nitrogen and air is used as the thermal fluid medium. However, in other embodiments of the present invention, a suitable thermal fluid medium can be selected according to actual requirements, and a thermally conductive metal block having a thermoelectric cooling chip or a chamber for receiving a thermal fluid medium may be substituted for the cold plate. As compared with the chamber for receiving a thermal fluid medium, the flow channel 40 used in the first embodiment is capable of enhancing the heat exchange between the thermal fluid medium and the cold plate. The cooling module 4 includes a first end face 41 (i.e. an upper surface) and a second end face 42 (i.e. a lower surface). The cooling module 4 functions to cool the electronic component C to a predetermined test temperature (i.e. a predetermined low temperature).

A thermally conductive metal block is used as the heating module 5 of the first embodiment. The thermally conductive metal block is abutted on the second end face 42 of the cooling module 4 and formed with a flow channel 50 extending zigzag through the thermally conductive metal block. By means of the flow channel 50, a high temperature thermal fluid medium is circulated through the thermally conductive metal block, so that the thermally conductive metal block is heated, and thus the electronic component is heated to a predetermined test temperature (i.e. a predetermined high temperature). Of course, the heating module 5 of the first embodiment is not limited to the thermally conductive metal block having the flow channel 50, and a thermal fluid medium receiving chamber or a heater directly mounted on the thermally conductive metal block may be substituted for the flow channel 50.

The pressing member 7 for contacting and pressing the electronic component C is arranged on the bottom of the heating module 5, and thus the electronic component C can be heated or cooled by heat conduction caused by direct contact. In other words, the electronic component C can be cooled or heated by the upper cooling module 4 or the heating module 5 through the lower pressing member 7. The pressing member 7 of the first embodiment is a modular member, that is, a suitable respective pressing member can be selected and mounted on the depressing head according to specifications of an electronic component to be tested. The finned heat sink 61 of the heat dissipation module 6 of the first embodiment is abutted on the first end face 41 of the cooling module 4, and heat can be transferred from the pressing member 7 to the finned heat sink 61 for heat dissipation by the heat pipe 62.

In the first embodiment, one end of the heat pipe 62 of the heat dissipation module 6 is arranged adjacent to the pressing member 7, so that the heat generated by the electronic component C can be transferred to the finned heat sink 61. In other embodiments of the present invention, one end of the heat pipe 62 may be embedded in the pressing member 7, so that it is closer to the electronic component C for better heat dissipation. In the first embodiment, a fan 63 is further provided on the top of the finned heat sink 61 for generating a forced cooling airflow across the finned heat sink 61, thereby improving heat dissipation.

In the following description, an operation process of the first embodiment will be described. At first, the electronic component C is moved to and placed in the chip socket 31 of the test base 3 by a pick and place arm (not shown) under control of a controller (not shown). Then, as shown in FIG. 2, the electronic component C is pressed by the depressing head 2 under control of the controller, so that contacts formed on the lower surface of the electronic component C are certainly contacted with probes. Prior to performing a high temperature test, the electronic component C is heated by the heating module 5 under control of the controller. If the electronic component C is heated to a predetermined high temperature, the high temperature test is initiated.

During the high temperature test, the temperature of the electronic component C is regulated by the heating module 5 continuously so as to maintain the electronic component C at a constant temperature. Since the electronic component C generates heat continuously in operation, it may cause the temperature of the electronic component C to be abnormally raised. In this case, excess heat can be continuously transferred to the finned heat sink 61 for heat dissipation by the heat pipe 62 of the heat dissipation module 6. If a temperature detector 9 detects that the temperature of the electronic component C rises abnormally, the fan 63 is activated by the controller for enhancing heat dissipation from the finned heat sink, thereby cooling the electronic component C by moving an airflow across the finned heat sink.

After the high temperature test is finished, the electronic component C is cooled, and then a low temperature test is performed. Before the low temperature test is initiated, the electronic component C is cooled to a specific temperature (for example, room temperature) by activation of the fan 63 for moving an airflow across the finned heat sink, and then the electronic component C is further cooled by filling liquid nitrogen into the cooling module 4 of the depressing head 2. In other words, the electronic device C is first cooled to a specific temperature (for example, room temperature) by means of the heat dissipation module 6 and then is cooled to a lower temperature by liquid nitrogen. In this way, all members or components are prevented from being intensely heated and cooled in a short time repeadly, and hence fatigue damage of the members or components can be prevented and the service life of the members or components can be extended. Moreover, consumption of liquid nitrogen can be significantly reduced.

Prior to performing the low temperature test, the electronic component C is cooled by filling liquid nitrogen into the cooling module 4 of the depressing head 2 under control of the controller. If the electronic component C is cooled to a predetermined low temperature (for example, −196° C.), the low temperature test is initiated. During the low temperature test, the temperature of the electronic component C is continuously regulated by the cooling module 4 so as to maintain the electronic component C at a constant predetermined low temperature. After the low temperature test is finished, the electronic component C is picked up from the chip socket 31 of the test base 3 and moved into a corresponding magazine by the pick and place arm under control of the controller.

Figure 3:
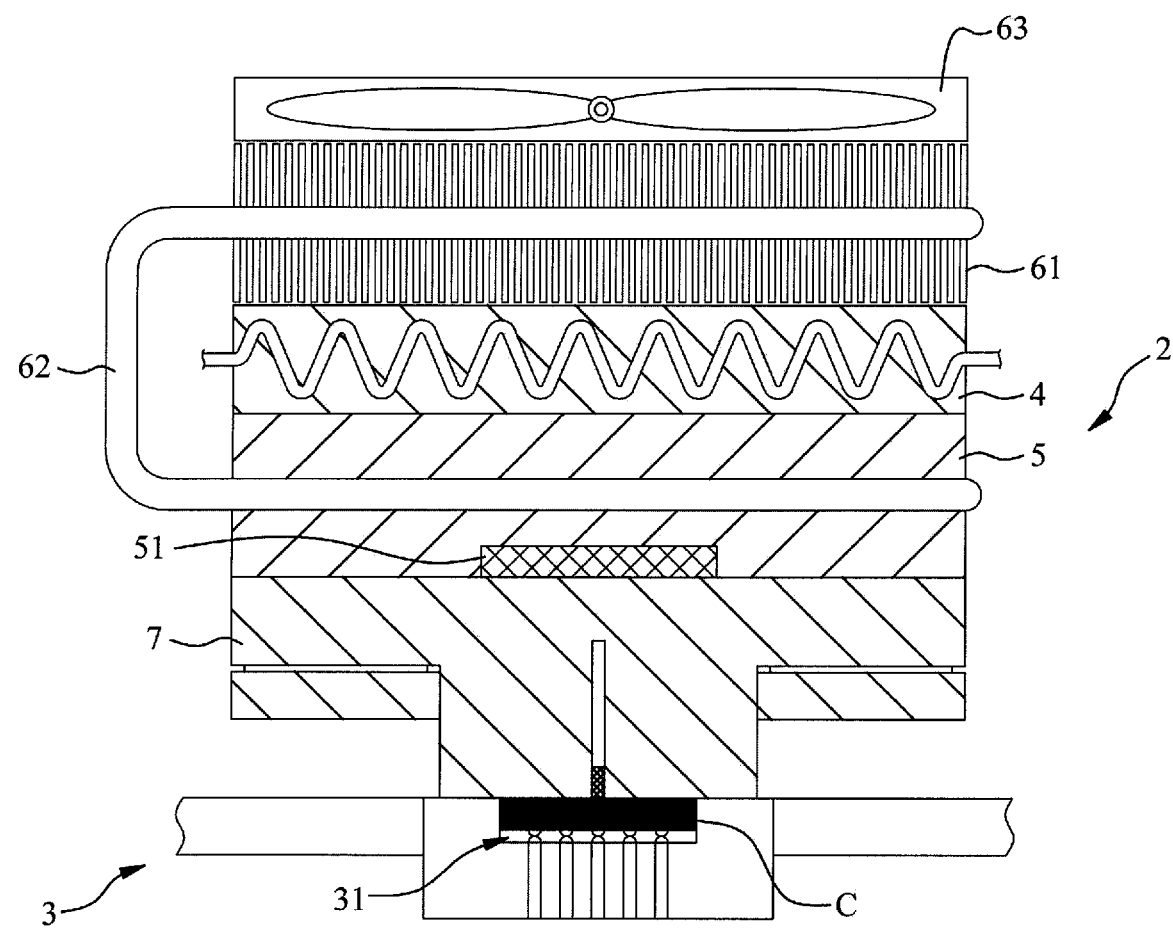
FIG. 3 is a schematic cross-sectional view of a second embodiment of the present invention.

In describing a second embodiment of the present invention, reference is made to FIG. 3. FIG. 3 is a schematic cross-sectional view showing the second embodiment of the present invention. The second embodiment of the present invention is different from the first embodiment in that in the heating module 5 of the second embodiment, a heater 51 is substituted for the combination of the flow channel 50 and the thermal fluid medium of the first embodiment. As such, a number of heating components can be greatly reduced, and the volume and cost for the heating components can be reduced.

Figure 4:
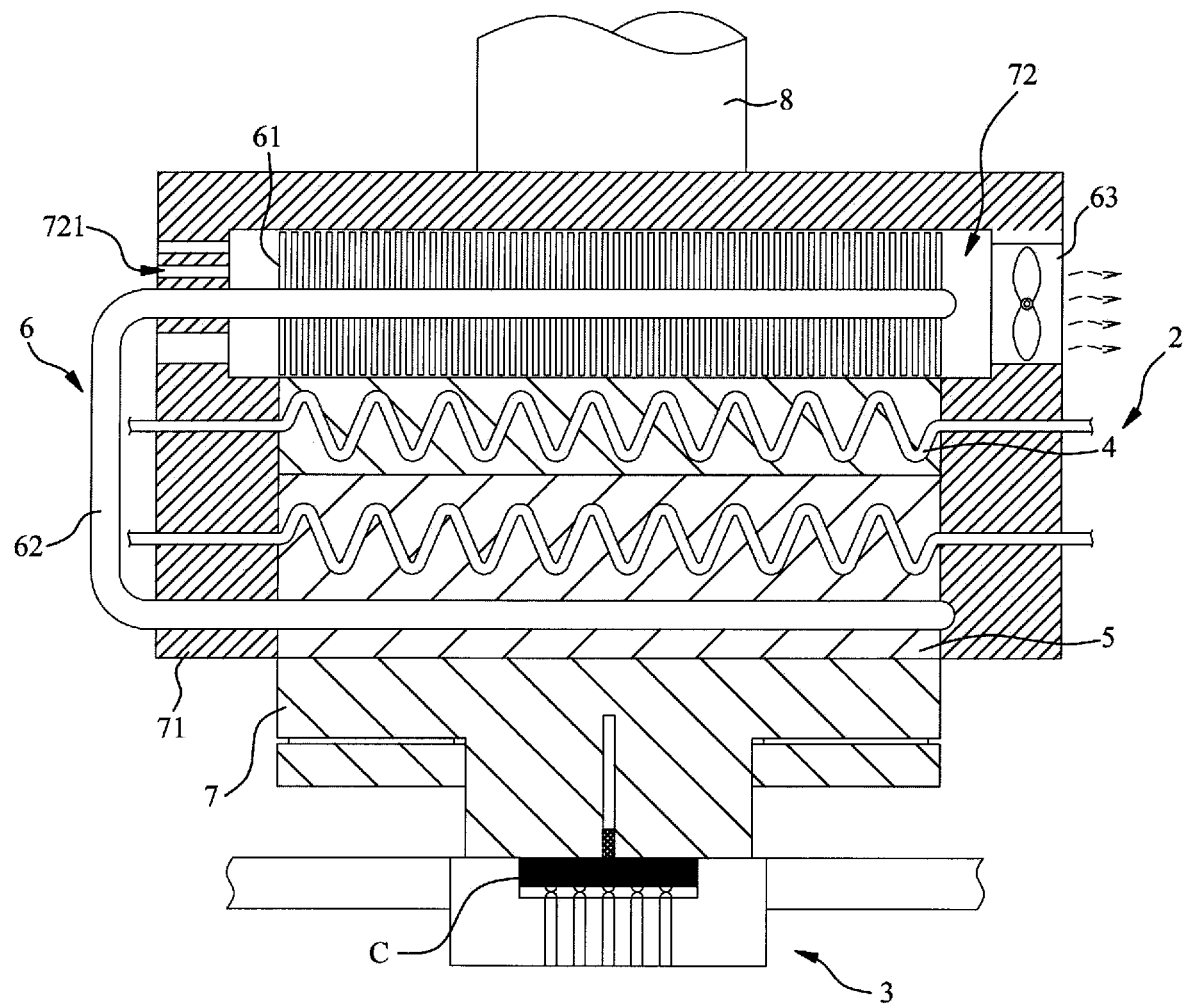
FIG. 4 is a schematic cross-sectional view of a third embodiment of the present invention.

In describing a third embodiment of the present invention, reference is made to FIG. 4. FIG. 4 is a schematic cross-sectional view showing the third embodiment of the present invention. The third embodiment is different from the first embodiment in that the third embodiment further comprises a depressing frame 71 which is connected with a depressing arm 8 and can be moved upwardly or downwardly by the depressing arm 8. Specifically, the cooling module 4, the heating module 5, the heat dissipation module 6 and the pressing member 7 of the third embodiment are mounted on the depressing frame 71, wherein the depressing frame 71 is provided with a heat dissipation chamber 72 in which the finned heat sink 61 is arranged, and a fan 63 is mounted on one of four circumferential side walls of the heat dissipation chamber 72 while a vent hole 721 is formed on the side wall of the four circumferential side walls opposite to the fan 63.

When the fan 63 is activated, external air is drawn into the heat dissipation chamber 72 through the vent hole 721, moved across the finned heat sink 61 for heat exchange and exhausted from the heat dissipation chamber 72 to the atmosphere by the fan 63. The depressing arm 8 is connected to the top of the depressing frame 71. When the depressing arm 8 is moved downwardly, the pressing member 7 is pressed on and contacted with the electronic component C by the depressing frame 71, and a force is generated in a downward direction for biasing the electronic component C.

In summary, the present invention has at least the following advantages:

1. A constant temperature test environment can be realized, and the electronic component to be tested can be rapidly heated and cooled, so that test efficiency is significantly improved.

2. The heat dissipation module is capable of transferring the heat generated by the electronic component under test to the finned heat sink through the heat pipe and of dissipating heat from the finned heat sink by moving an airflow across the finned heat sink by activation of the fan, so that the test is prevented from being disadvantageously affected while the electronic component under test is maintained at a constant temperature.

3. The fan is not only capable of enhancing heat dissipation from the finned heat sink but also capable of dissipating heat of the electronic component in a controllable manner by activation or inactivation of the fan, that is, the temperature can be regulated by the fan.

4. In the case that the high temperature test and the low temperature test are performed in this order, the electronic component can be cooled to about room temperature by the heat dissipation module and then cooled to a lower temperature by liquid nitrogen, thereby extending the service life and greatly reducing the consumption of liquid nitrogen.

It should be understood that the embodiments and the accompanying drawings have been described for illustrative purposes and are not limiting. Accordingly, it is intended that the invention not be limited to the disclosed embodiments, but that it have the full scope permitted by the language of the following claims.

What is claimed is:

1. An apparatus for a high temperature test and a low temperature test, comprising a depressing head and a test base, the test base comprising a chip socket for receiving an electronic component, the depressing head being arranged to press the electronic component, the depressing head comprising:
    a cooling module configured to cool the electronic component for performing the low temperature test, the cooling module comprising a first end face and a second end face;
    a heating module configured to heat the electronic component for performing the high temperature test, the heating module being abutted on the second end face of the cooling module; and
    a heat dissipation module, comprising a heat sink and at least one heat conduction member, the heat sink being abutted on the first end face of the cooling module, the at least one heat conduction member being thermally coupled to the heating module and the heat sink.

2. The apparatus of claim 1, further comprising a pressing member connected to the heating module for pressing the electronic component.

3. The apparatus of claim 2, further comprising a depressing frame and a depressing arm, wherein the cooling module, the heating module, the heat dissipation module and the pressing member are mounted on the depressing frame, and the depressing arm is connected to the depressing frame for moving the depressing frame upwardly or downwardly.

4. The apparatus of claim 1, wherein at least one of the cooling module and the heating module is provided with a chamber into which a thermal fluid medium is to be filled or a flow channel through which the thermal fluid medium is to be circulated.

5. The apparatus of claim 1, wherein the heating module comprises a heater.

6. The apparatus of claim 1, wherein the heat dissipation module further comprises a fan disposed on one side of the heat sink.

7. A method for a high temperature test and a low temperature test, comprising the steps of:
    (A) providing an electronic component onto a test base and pressing the electronic component by a depressing head; and
    (B) heating or cooling the electronic component by the depressing head so that a temperature of the electronic device reaches a predetermined high temperature or a predetermined low temperature prior to performing the high temperature test or the low temperature test,
    wherein when the low temperature test is performed, the electronic component is cooled by filling liquid nitrogen into a cooling module of the depressing head;
    wherein when the high temperature test is performed, the electronic component is heated by a heating module of the depressing head, and if the temperature of the electronic component is higher than the predetermined high temperature, the electronic component is cooled by a heat dissipation module of the depressing head.

8. The method of claim 7, wherein the heat dissipation module comprises a heat sink and at least one heat conduction member, and the at least one heat conduction member is thermally coupled to the heating module and the heat sink.

9. The method of claim 8, wherein the heat dissipation module further comprises a fan,
    when the high temperature test is performed, the electronic component is cooled by moving an airflow across the heat sink by activation of the fan if the temperature of the electronic component is higher than the predetermined high temperature.

10. The method of claim 9, wherein in a case that the high temperature test and the low temperature test are performed in this order, after the high temperature test is finished and before the low temperature test is initiated, the electronic component is cooled to a specific temperature by moving the airflow across the heat sink by activation of the fan, and then the electronic component is further cooled to the predetermined low temperature by filling the liquid nitrogen into the cooling module of the depressing head.

* * * * *